United States Patent
Yang et al.

(10) Patent No.: US 9,293,331 B2
(45) Date of Patent: Mar. 22, 2016

(54) MECHANISMS FOR MONITORING ION BEAM IN ION IMPLANTER SYSTEM

(71) Applicant: Taiwan Semiconductor Manufacturing Co., Ltd., Hsin-Chu (TW)

(72) Inventors: Yuan-Fu Yang, Bade (TW); Ping-Fang Chen, Toufen Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 111 days.

(21) Appl. No.: 14/013,604

(22) Filed: Aug. 29, 2013

(65) Prior Publication Data

US 2015/0064814 A1 Mar. 5, 2015

(51) Int. Cl.
*H01L 21/265* (2006.01)
*H01J 37/317* (2006.01)
*H01J 37/20* (2006.01)
*H01J 37/244* (2006.01)

(52) U.S. Cl.
CPC ............... *H01L 21/265* (2013.01); *H01J 37/20* (2013.01); *H01J 37/244* (2013.01); *H01J 37/3171* (2013.01); *H01J 2237/2007* (2013.01); *H01J 2237/20214* (2013.01); *H01J 2237/24405* (2013.01)

(58) Field of Classification Search
None
See application file for complete search history.

(56) References Cited

U.S. PATENT DOCUMENTS

| | | | |
|---|---|---|---|
| 2001/0032937 A1* | 10/2001 | Berrian | 250/492.2 |
| 2003/0197132 A1 | 10/2003 | Keum et al. | |
| 2004/0007679 A1* | 1/2004 | Viviani | 250/492.21 |
| 2006/0097196 A1* | 5/2006 | Graf et al. | 250/492.21 |

FOREIGN PATENT DOCUMENTS

TW 503434 9/2002

* cited by examiner

*Primary Examiner* — Charles Garber
*Assistant Examiner* — Alia Sabur
(74) *Attorney, Agent, or Firm* — Birch, Stewart, Kolasch & Birch, LLP

(57) ABSTRACT

In accordance with some embodiments, an assembly of an ion implanter system is provided. The assembly includes a control unit, a wafer holder and a detecting device. The wafer holder and the detecting device are respectively positioned at two sides of the control unit. The control unit is configured to drive the wafer holder and the detecting device to rotate about at least one rotation axis.

20 Claims, 14 Drawing Sheets

MECHANISMS FOR MONITORING ION BEAM IN ION IMPLANTER SYSTEM

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

Ion implantation is an important process in semiconductor manufacturing for doping different atoms or molecules into a wafer. By employing ion implantation, the majority charge carriers of the implanted portions of the wafer may be altered so as to produce different types and levels of conductivity in regions of a wafer. Ion implanters are automated tools which are used to perform the ion implantation. In an ion implanter, an ion generator may generate an ion beam and direct the ion beam towards the target wafer. The target wafer should be handled properly onto the wafer holder for the implanter to properly implant the target wafer. The wafer holder may be used to hold the target wafer and avoid wafer breakage. In addition, it is important to achieve a uniform distribution of ions on the target wafer. If the implantation is not uniform, the dopant profile and an electronic device applying semiconductors of the wafer may be adversely affected.

Consequently, it is desirable to monitor the ion dose distribution of the ion beam generated by an ion implanter so that control of the ion implantation process may be improved.

BRIEF DESCRIPTION OF THE DRAWINGS

For a more complete understanding of the embodiments, and the advantages thereof, reference is now made to the following descriptions taken in conjunction with the accompany drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

FIGS. 1-11 have been simplified for the sake of clarity to better understand the embodiments of the present disclosure. Throughout the various views and illustrative embodiments, like reference numbers are used to designate like elements.

Figure 1:
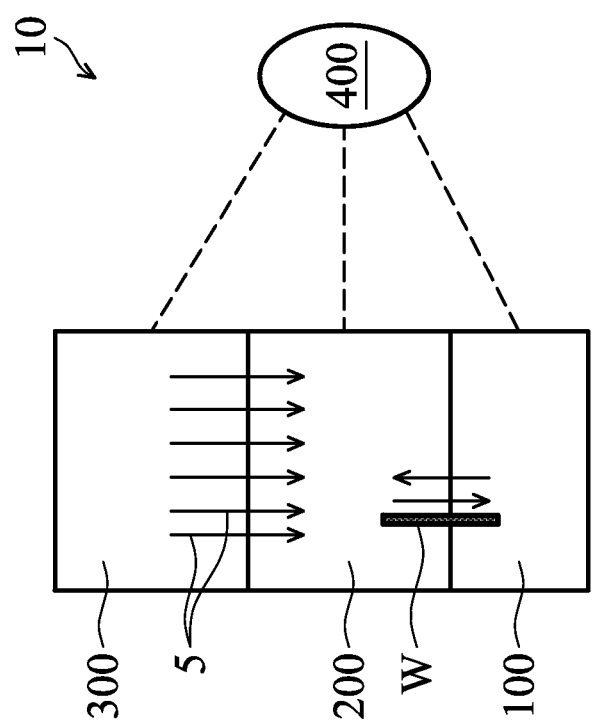
FIG. 1 is a schematic diagram of an ion implanter system, in accordance with some embodiments.

FIG. 1 is a schematic diagram of an ion implanter system 10, in accordance with some embodiments. The ion implanter system 10 includes a wafer handling module 100, a wafer process module 200, an ion beam generator module 300, and a control unit 400. A wafer W supplied by the wafer handling module 100 is transferred into the wafer process module 200. The wafer process module 200 encloses the wafer W to receive ions of an ion beam 5 generated by the ion beam generator module 300. Additional features can be added to the ion implanter system 10, and some of the features described below can be replaced or eliminated in other embodiments of the ion implanter system 10.

Figure 2:
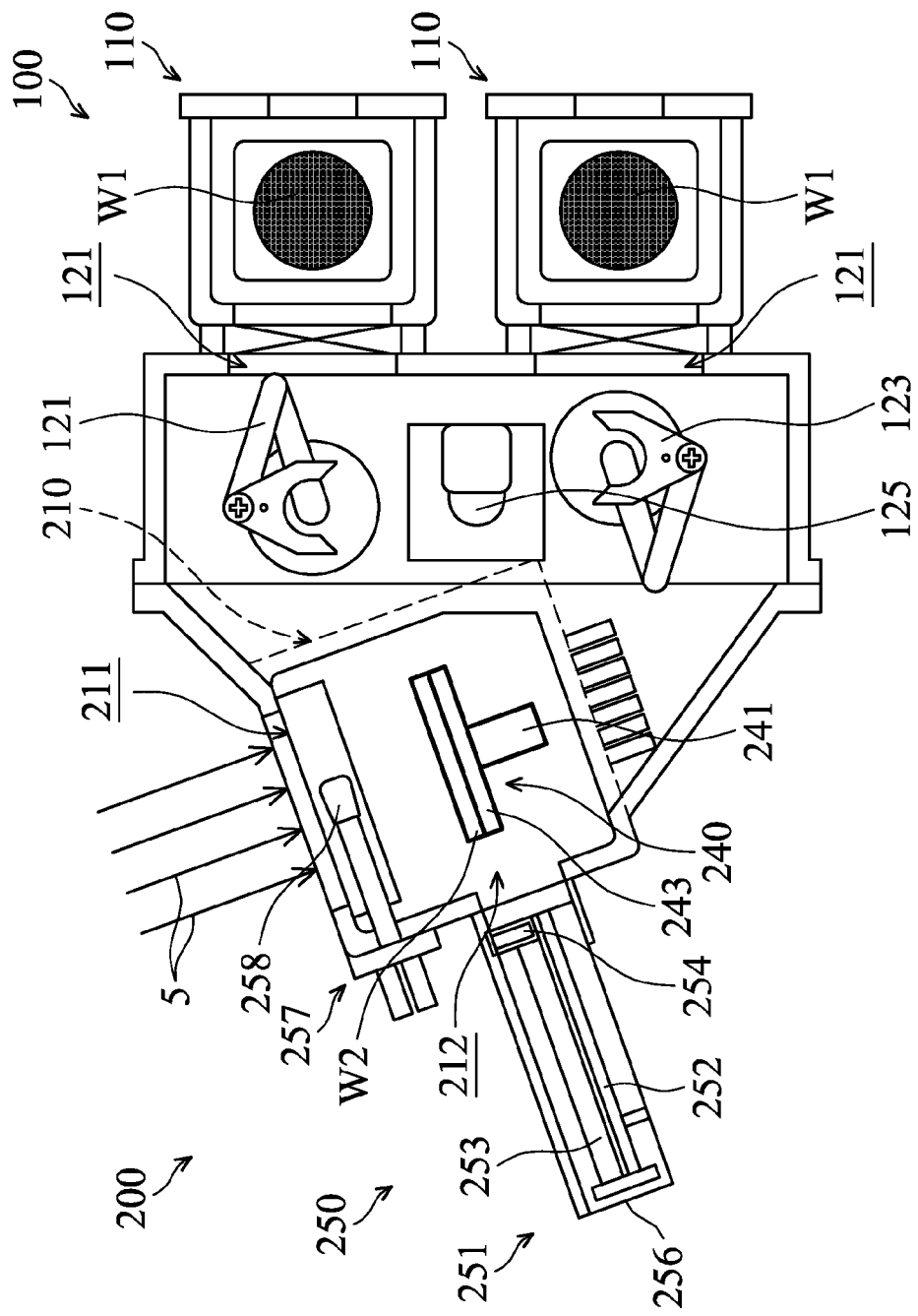
FIG. 2 is a top view of a wafer handling module and a wafer process module, in accordance with some embodiments.

As shown in FIG. 2, the wafer handling module 100 includes one or more input wafer cassettes 110, one or more robotic arms such as robotic arms 121 and 123, and an orienter 125, in accordance with some embodiments. A number of wafers W1 are placed in the two input wafer cassettes 110. The wafers W1 may have been implanted or may to be implanted. A wafer W2 is transferred to the wafer process module 200 by the two robotic arms 121 and 123, and the orienter 125 to be implanted. The wafers W1 and W2 may be made of silicon or other semiconductor materials such as silicon germanium. The wafers W1 and W2 may go through many processing steps, such as lithography, etching, and/or doping before a completed die is formed.

In some embodiments, the wafer W2 is retrieved from one of the two input wafer cassettes 110 via a passage 121 by one of the robotic arms 121 or 123 and transferred to the orienter 125. The wafer W2 is rotated to a particular orientation by the orienter 125. Afterwards, the other robotic arm 121 or 123 retrieves the oriented wafer W2 and moves it to the wafer process module 200.

The wafer process module 200 includes an end station chamber 210 and a mechanical scan drive assembly 240, in accordance with some embodiments. The end station chamber 210 has two openings 211 and 212 formed at different positions thereof. For example, the two openings 211 and 212 are formed at two side walls of the end station chamber 210. The ion beam 5 from the ion beam generator module 300 (as shown in FIG. 1) enters the end station chamber 210 via the opening 211.

The mechanical scan drive assembly 240 is positioned in the end station chamber 210. The mechanical scan drive assembly 240 includes a control unit 241 and a wafer holder 243, in accordance with some embodiments. The wafer W2 is secured by the wafer holder 243 by suitable mechanical fixing means, such as clamp assemblies, and the wafer holder 243 is controlled by the control unit 241. Therefore, the wafer W2 within the end station chamber 210 is driven to facilitate selective encounters with the ion beam 5 from the ion beam generator module 300 (as shown in FIG. 1). For example, the control unit 241 maneuvers the wafer holder 243, that holds the wafer W2, about one or more axes to change the implantation angle.

The quality of the completed die depends on the uniformity of ions doped in the wafer W2. For example, an uneven distribution of dopants in the wafer W2 may cause poor drive current uniformity (IdU) or threshold voltage uniformity (VtU) in transistors of the wafer W2.

In order to achieve a uniform ion dose distribution during an ion implantation process, a number of detecting devices are used to monitor ion beam information, such as an ion dose distribution, ion beam density, ion beam incident angle, etc. In some embodiments, the wafer process module 200 further includes a detector assembly 250. The detector assembly 250 includes a first detector unit 251 and a second detector unit 257.

The first detector unit 251 is connected to the end station chamber 210 via the opening 212. The first detector unit 251 includes a trail rail 252, a lever 253, a detecting device 254, and a housing 256, in accordance with some embodiments. The trail rail 252 is disposed in the housing 256, and the lever 253 is movably connected to the trail rail 252. The detecting device 254 is positioned at one end of the lever 253 so as to be selectively moved into the end station chamber 210 via the opening 212. In some embodiments, the detecting device 254 is configured to monitor the ion dose distribution.

The second detector unit 257 is disposed in a vicinity of the opening 211 of the end station chamber 210. The second detector unit 257 includes a detecting device 258. In some embodiments, the detecting device 258 is configured to monitor the ion beam density of the ion beam 5.

With reference to FIGS. 1 and 2, the detecting signal produced by the detecting devices 254 and 258 are transmitted to the controller module 400, in accordance with some embodiments. Based upon the detecting signals of the detecting devices 254 and 258, the controller module 400 calculates the information of the ion beam 5.

Figure 3A:
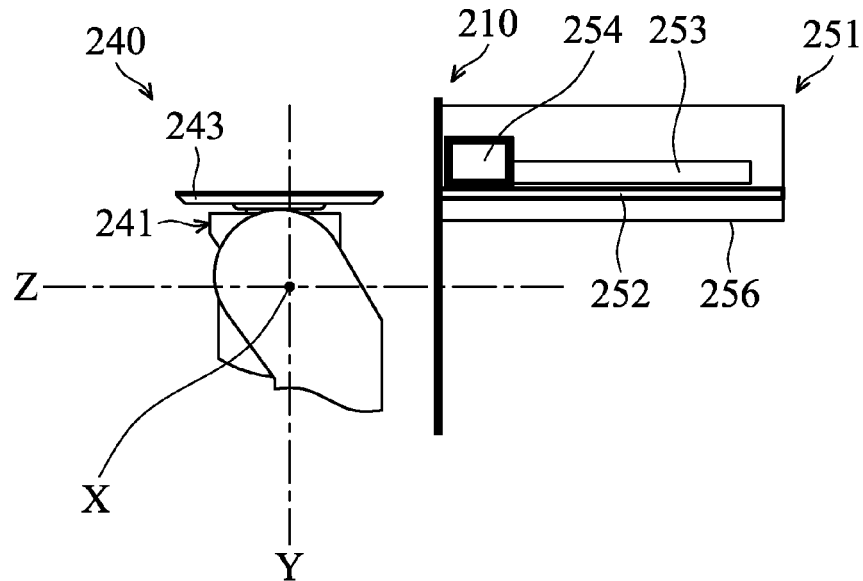
FIGS. 3A-3E are side views of various stages of a process for monitoring ion beams in an end station chamber, in accordance with some embodiments.
Figure 3B:
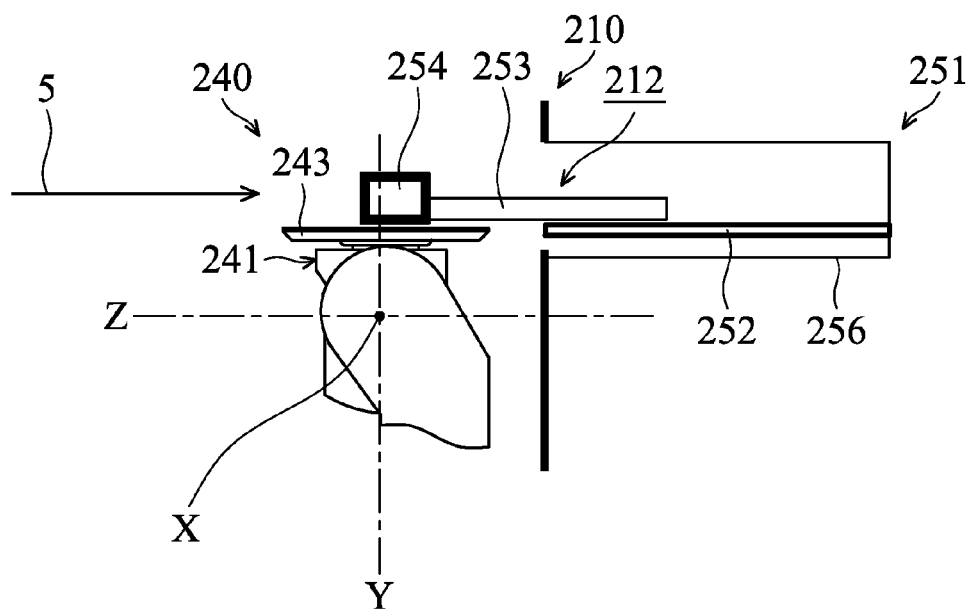

With reference to FIGS. 3A-3E, some operational methods of the mechanical scan drive assembly 240 are described hereinafter, in accordance with some embodiments. As shown in FIG. 3A, before implantation process, the detecting device 254 is positioned in the housing 256. The housing 256 is closed and is pumped down to a desired vacuum. Afterwards, as shown in FIG. 3B, the lever 253 is stretched out the housing 256. The detecting device 254 is moved to a position over the wafer holder 243. The detecting device 254 is used to receive ions of the ion beam 5 and produces detecting signals to the controller module 400, as shown in FIG. 1. If the detecting signals do not meet predetermined criteria, the controller module 400 controls the ion beam generator module 300 to adjust the ion beam 5 to meet the predetermined criteria.

Figure 3C:
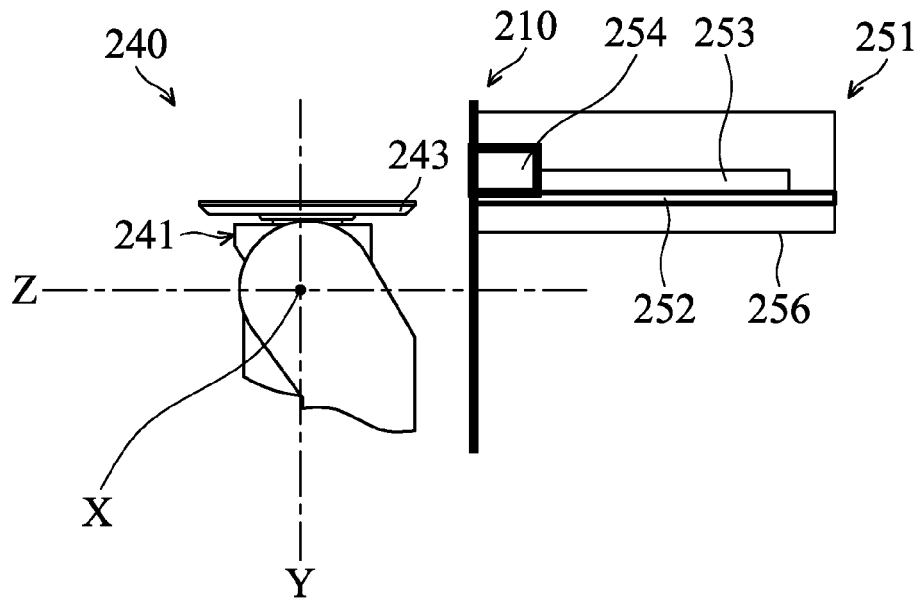
Figure 3D:
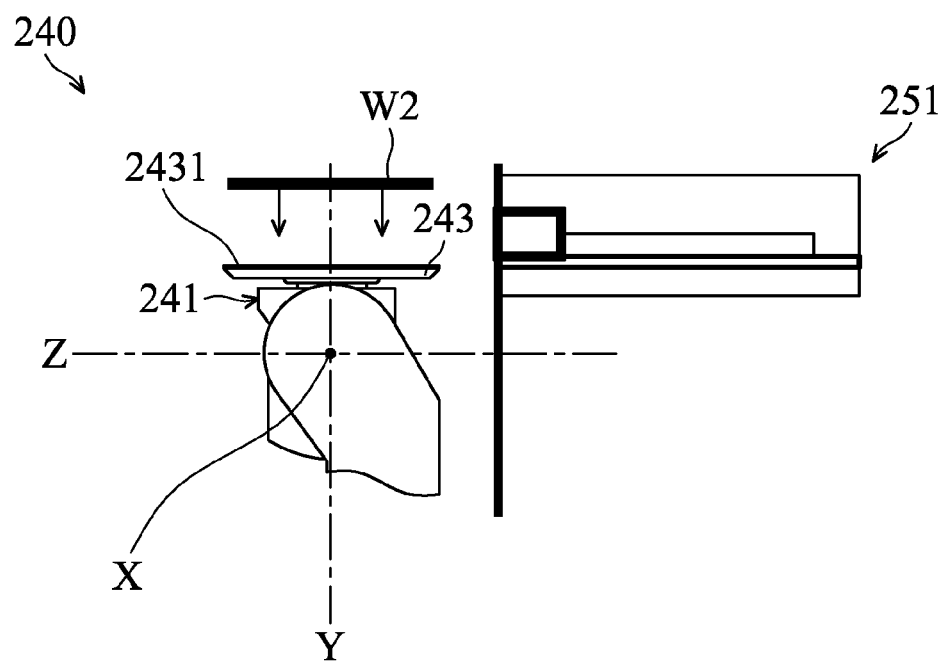
Figure 3:
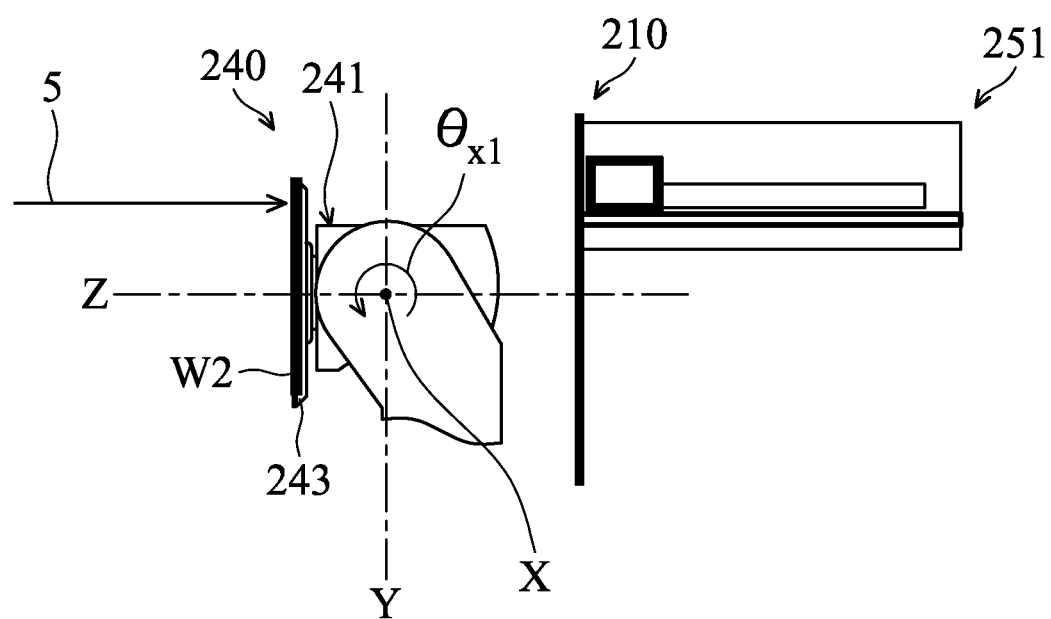

After ion beam tuning, as shown in FIG. 3C, the detecting device 254 is returned to the housing 256, and the housing 256 is closed. Afterwards, the wafer W2 is loaded on a supporting surface 2431 of the wafer holder 243, as shown in FIG. 3D. Afterwards, the control unit 241 is rotated by the angle $\theta_{x1}$ about a horizontal axis X of 90 degrees counterclockwise, as shown in FIG. 3E, such that wafer W2 can be implanted by the ion beam 5.

With reference to FIG. 2, a problem with the wafer process module 200 is that detecting device 254 needs to be moved into the end station chamber 210 from the housing 256 in each operation for ion beam tuning. Therefore, it is time consuming and reduces productivity. Also, contaminating particles falling from the detecting device 254 or the lever 253 may cause contamination. Furthermore, since the housing 256 and the end station chamber 210 are under different vacuum pressures, the vacuum pressures in the end station chamber 210 may not be maintained after the housing 256 is opened.

Therefore, it is desirable to find an alternative wafer process module, which is capable of reducing or resolving the problems mentioned above.

Figure 4:
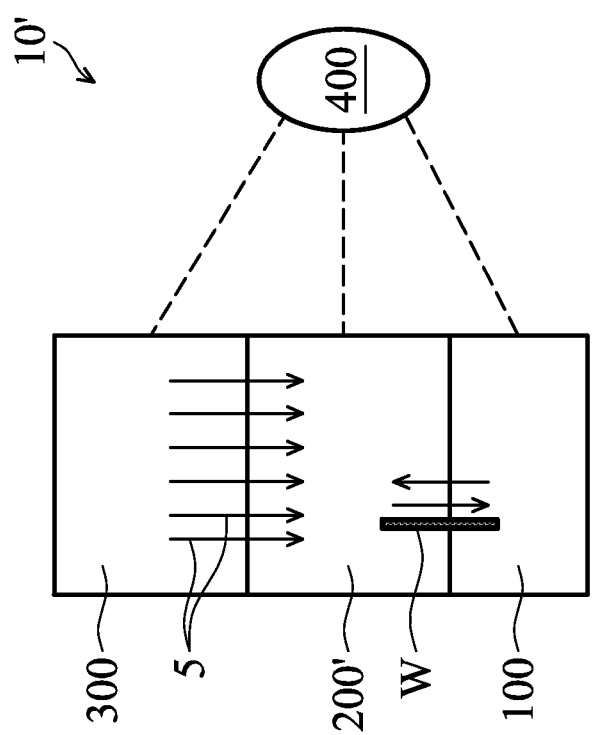
FIG. 4 is a schematic diagram of an ion implanter system, in accordance with some embodiments.

FIG. 4 is a schematic diagram of an ion implanter system 10', in accordance with some embodiments. The ion implanter system 10' includes the wafer handling module 100, a wafer process module 200', the ion beam generator module 300, and the controller module 400.

Figure 5:
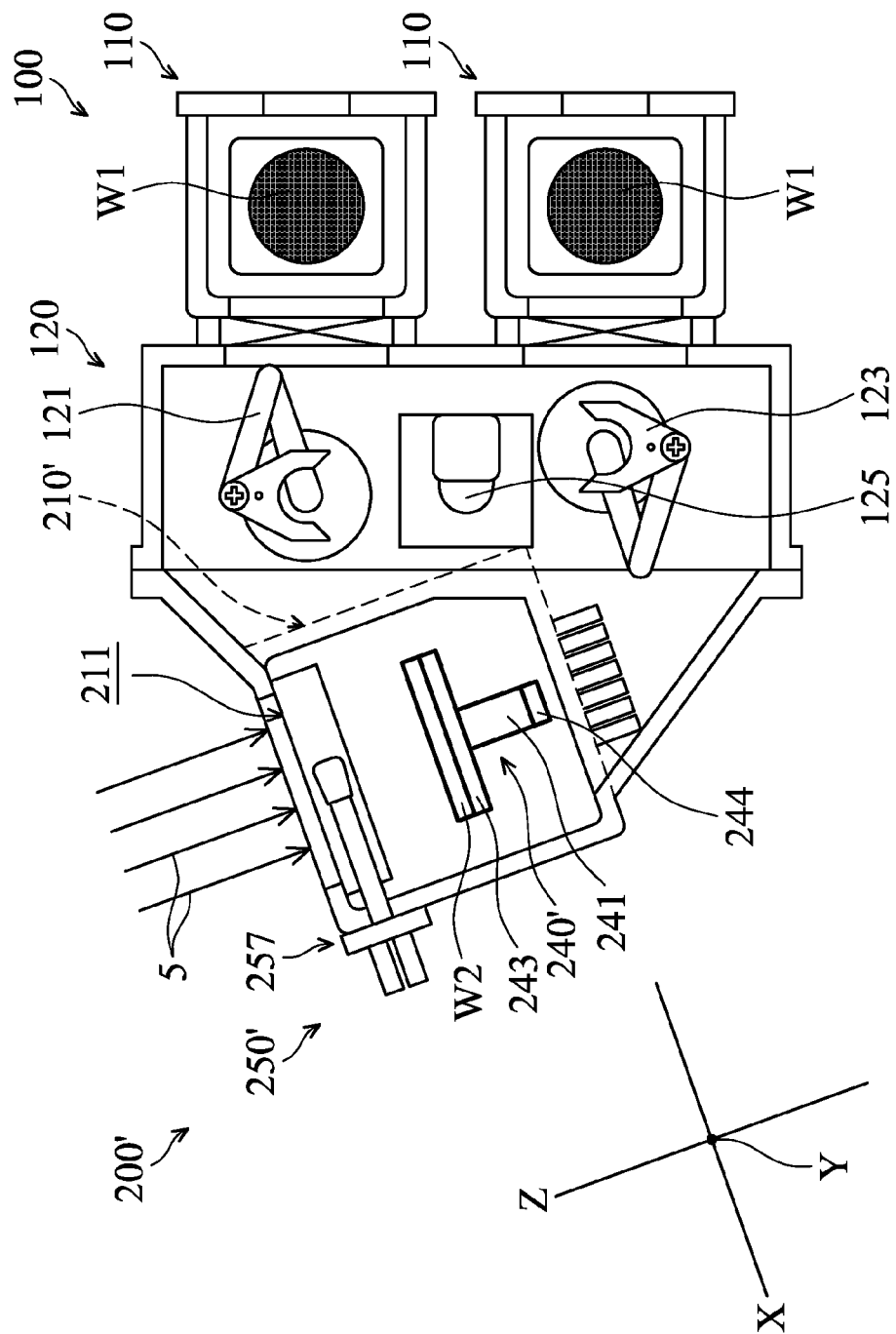
FIG. 5 is a top view of a wafer handling module, and a wafer process module, in accordance with some embodiments.

As shown in FIG. 5, the wafer process module 200' includes an end station chamber 210', a mechanical scan drive assembly 240', and a detector assembly 250', in accordance with some embodiments. The end station chamber 210' differs from the end station chamber 210, shown in FIG. 2, in that the end station chamber 210' omits the opening 212. The detector assembly 250' differs from the detector assembly 250 shown in FIG. 2 in that the detector assembly 250' omits the first detector unit 251.

Figure 6A:
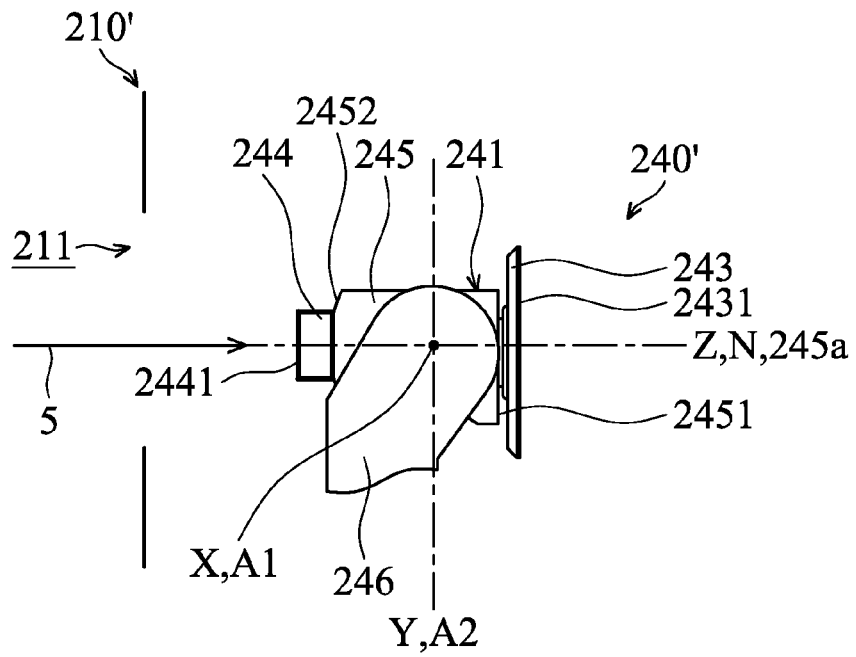
FIGS. 6A-6D are side views of various stages of a process for monitoring ion beam in an end station chamber, in accordance with some embodiments.

As shown in FIG. 6A, the mechanical scan drive assembly 240' includes the control unit 241, the wafer holder 243, and a detecting device 244, in accordance with some embodiments. The wafer holder 243 and the detecting device 244 are respectively positioned at two sides of the control unit 241. For example, the wafer holder 243 and the detecting device 244 are respectively positioned at two opposite sides of the control unit 241. As such, the wafer holder 243 and the detecting device 244 are simultaneously driven by the control unit 241 to rotate about one or more axes.

In some embodiments, the control unit 241 includes a first drive mechanism 245 and a second drive mechanism 246. The first drive mechanism 245 includes an electric machine, such as step motor, to actuate the first drive mechanism 245 to rotate about a rotation axis A1. The first drive mechanism 245 has a cylindrical configuration with an anterior surface 2451 and a posterior surface 2452 opposite to the anterior surface 2451. The wafer holder 243 and the detecting device 244 are respectively mounted at the anterior surface 2451 and the posterior surface 2452.

In some embodiments, the wafer holder 243 is positioned over a center of the anterior surface 2451, and the detecting device 244 is positioned over a center of the posterior surface 2452. Namely, the wafer holder 243 and the detecting device 244 are arranged along a central axis 245a which penetrates the centers of the anterior surface 2451 and the posterior surface 2452.

In some embodiments, as shown in FIG. 6A, the wafer holder 243 has a supporting surface 2431 for supporting a wafer such as the wafer W2, and the detecting device 244 has an ion beam receiving surface 2441. The supporting surface 2431 and the ion beam receiving surface 2441 are perpendicular to the central axis 245a. In some embodiments, a distance between the supporting surface 2431 and the rotation axis A1 is equal to a distance between the ion beam receiving surface 2441 and the rotation axis A1. In some embodiments, the detecting device 244 is positioned at the posterior surface 2452 and offsets to the central axis 245a. In other embodiments, the detecting device 244 is embedded in the posterior surface 2452 of the first drive mechanism 245.

The second drive mechanism 246 is connected to the first drive mechanism 245 via the rotation axis A1. The second drive mechanism 246 includes an electric machine, such as step motor, to actuate the second drive mechanism 246 to rotate about a rotation axis A2. In some embodiments, the electric machine is used to actuate the second drive mechanism 246 to move in a vertical direction parallel to a vertical axis Y shown in FIG. 6A. In some embodiments, the second drive mechanism 246 is rotatable about a rotation axis A2 that is parallel to the vertical axis Y (rather than rotatable about the vertical axis Y).

With reference to FIGS. 6A-6D, some exemplary operational methods of the mechanical scan drive assembly 240' are described hereinafter. It is understood that additional processes may be performed before, during, and/or after the method depicted in FIGS. 6A-6D, and that some other processes may only be briefly described herein.

In some embodiments, as shown in FIG. 6A, prior to the ion implantation process, the ion beam is tuned. At the start of beam tuning, the control unit 241 is operated in a first operating state.

In the first operating state of the control unit 241, the wafer holder 243 is farther away from the opening 211 of the end station chamber 210' than the detecting device 244. The ion beam receiving surface 2441 of the detecting device 244 faces the opening 211 of the end station chamber 210'. The supporting surface 2431 of the wafer holder 243 faces a direction away from the opening 211 of the end station chamber 210'. The central axis 245a of the first drive mechanism 241 is substantially coincident to a horizontal axis Z, as shown in FIG. 6A. Therefore, the ion beam receiving surface 2441 of the detecting device 244 is perpendicular to the main travelling direction N of the ion beam 5. The ions of the ion beam 5 are directed into the ion beam receiving surface 2441 of the detecting device 244 orthogonally.

The detecting device 244 receives the ions and produces an electrical signal to the controller module 400, as shown in FIG. 4. The controller module 400 instructs some elements of the ion implanter to adjust the ion beam 5. In some embodiments, the controller module 400 adjusts either the scanning frequency of the ion beam 5, the movement speed of the mechanical scan drive assembly 240' or a combination thereof by employing a feedback algorithm.

Figure 6B:
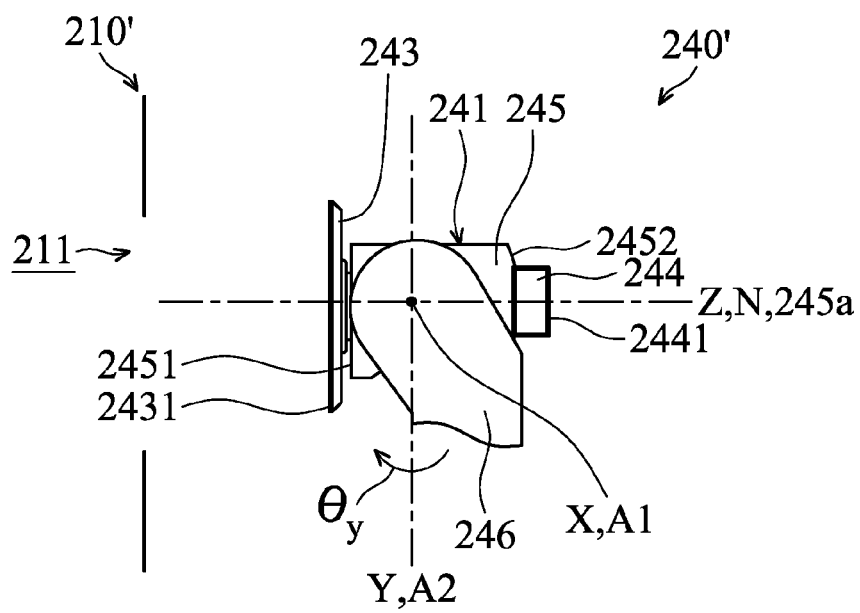
Figure 6C:
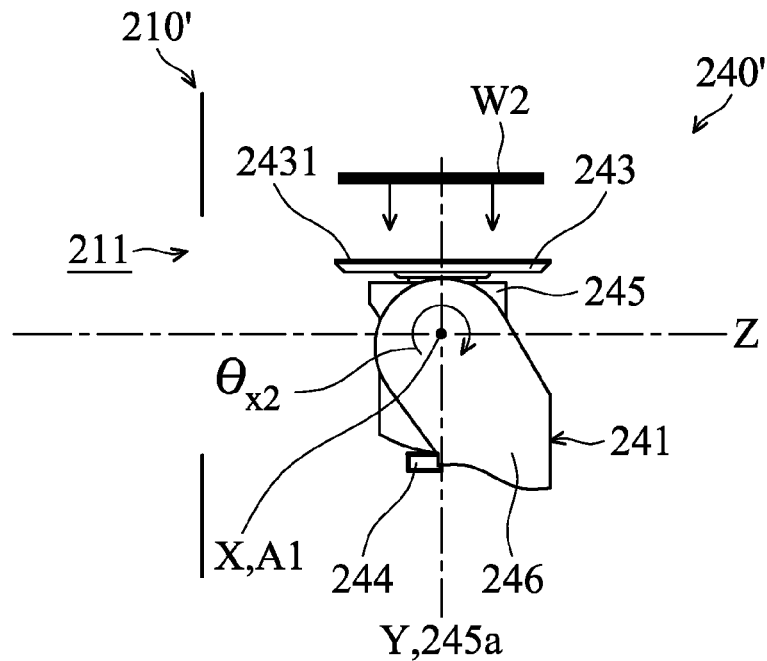

In some embodiments, after ion beam tuning, the first and second drive mechanisms 245 and 246 are actuated. The second drive mechanism 246 is rotated about the rotation axis A2 by the angle $\theta_y$ of about 180 degrees such that the supporting surface 2431 of the wafer holder 243 faces the opening 211, as shown in FIG. 6B. The first drive mechanism 245 is rotated about the rotation axis A1 by the angle $\theta_{x2}$ of about 90 degrees clockwise, as shown in FIG. 6C. The supporting surface 2431 is perpendicular to the vertical axis Y. The wafer W2 is loaded on the supporting surface 2431 and fixed by suitable mechanical fixing means, such as clamp assemblies.

Figure 6D:
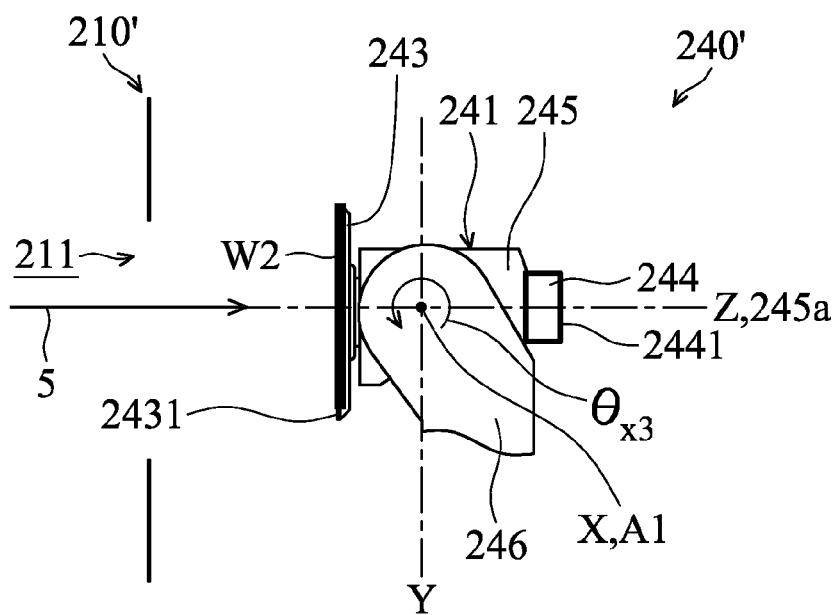

Afterwards, as shown in FIG. 6D, the first drive mechanism 245 is rotated about the rotation axis A1 by the angle $\theta_{x3}$ of about 90 degrees counterclockwise such that the wafer W2 faces the opening 211. Therefore, a second operating state of the control unit 241 is ready to begin.

In the second operating state of the control unit 241, the wafer holder 243 is closer to the opening 211 of the end station chamber 210' than the detecting device 244. The supporting surface 2431 of the wafer holder 243 faces the opening 211 of the end station chamber 210'. The ion beam receiving surface 2441 of the detecting device 244 faces a direction away from the opening 211 of the end station chamber 210'. The central axis 245a of the first drive mechanism 241 is substantially coincident to the horizontal axis X, as shown in FIG. 6D. Therefore, a surface of the wafer W2 is substantially perpendicular to the main travelling direction N of the ion beam 5. The ion beam 5 is directed onto the surface of the wafer W2 orthogonally. Since the ion beam 5 is adjusted, the implantation quality of the wafer W2 is improved.

Figure 7:
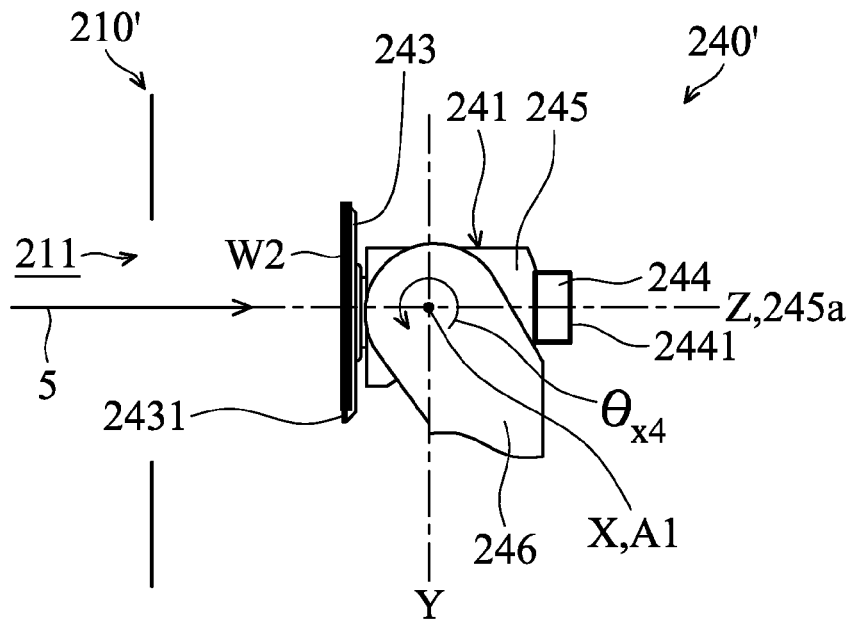
FIG. 7 is a side view of a mechanical scan drive assembly monitoring an ion beam, in accordance with some embodiments.

Operation methods of a mechanical scan drive assembly should not be limited by the above-mentioned embodiments. FIG. 7 is a side view of a mechanical scan drive assembly 240', in accordance with some embodiments. In some embodiments, prior the control unit 241 is operated to the first operating state, the wafer W2 is loaded on the wafer holder 243. After beam tuning, the first drive mechanism 245 is rotated about the rotation axis A1 by a rotation angle $\theta_{x4}$ of about 180 degrees counterclockwise, to allow the ion beam 5 to strike the wafer W2, as shown in FIG. 7.

Figure 8:
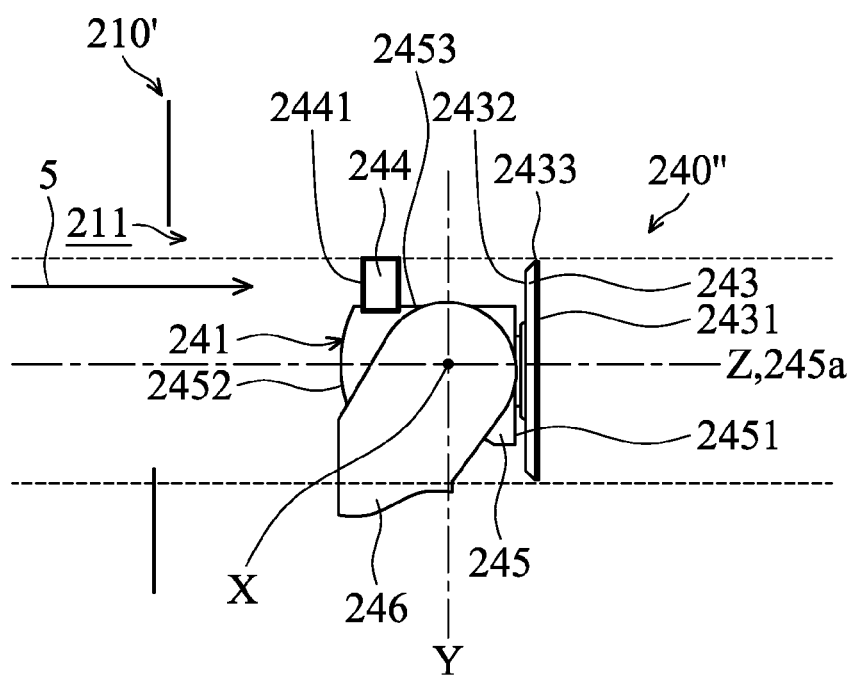
FIG. 8 is a side view of a mechanical scan drive assembly monitoring an ion beam, in accordance with some embodiments.

The arrangement of the mechanical scan drive assembly can be modified based on user demands and should not be limited by the above-mentioned embodiments. As shown in FIG. 8, in some embodiments, the detecting device 244 of a mechanical scan drive assembly 240" is positioned at an upper surface 2453 of the first drive mechanism 245. The upper surface 2453 is connected between the anterior surface 2451 and the posterior surface 2453. The ion beam receiving surface 2441 face the opening 211 of the end station chamber 210' directly in the first operating state of the control unit 241. Namely, the ion beam receiving surface 2441 is substantially perpendicular to the main travelling direction N of the ion beam 5. Ions of the ion beam 5 enter the detecting device 244 orthogonally.

The detecting device 244 may be disposed at any surface of the first drive mechanism 245. In some embodiments, the orthogonal projection of the detecting device 244 formed on a back surface, a surface opposite to the supporting surface 2431, of the wafer holder 243 is within the edges 2433, as indicated by the dotted lines in FIG. 8. In some embodiments, in the first operating state of the control unit 241' of the mechanical scan drive assembly 240', the ion beam receiving surface 2441 of the detecting device 244 is not perpendicular to the central axis 245a of the first drive mechanism 245.

Figure 9:
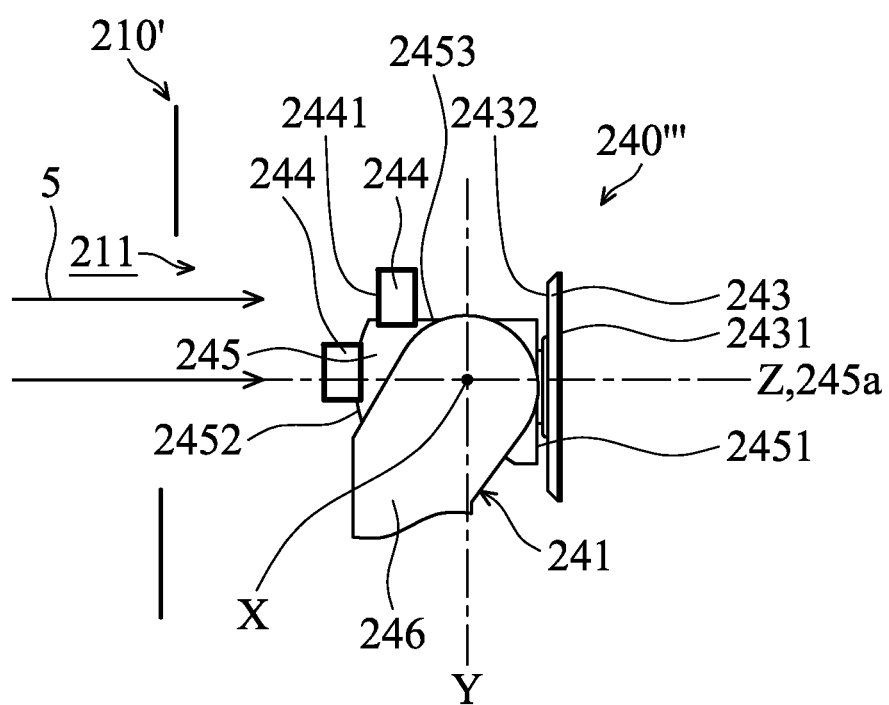
FIG. 9 is a side view of a mechanical scan drive assembly monitoring an ion beam, in accordance with some embodiments.

As shown in FIG. 9, in some embodiments, a mechanical scan drive assembly 240''' includes multiple detecting devices 244, in accordance with some embodiments. For example, the mechanical scan drive assembly 240''' includes two detecting devices 244. One of the detecting devices 244 is disposed over the center of the posterior surface 2412 of the first drive mechanism 245, and the other one of the detecting devices 244 is disposed on the upper surface 2453 of the first drive mechanism 245.

Figure 10:
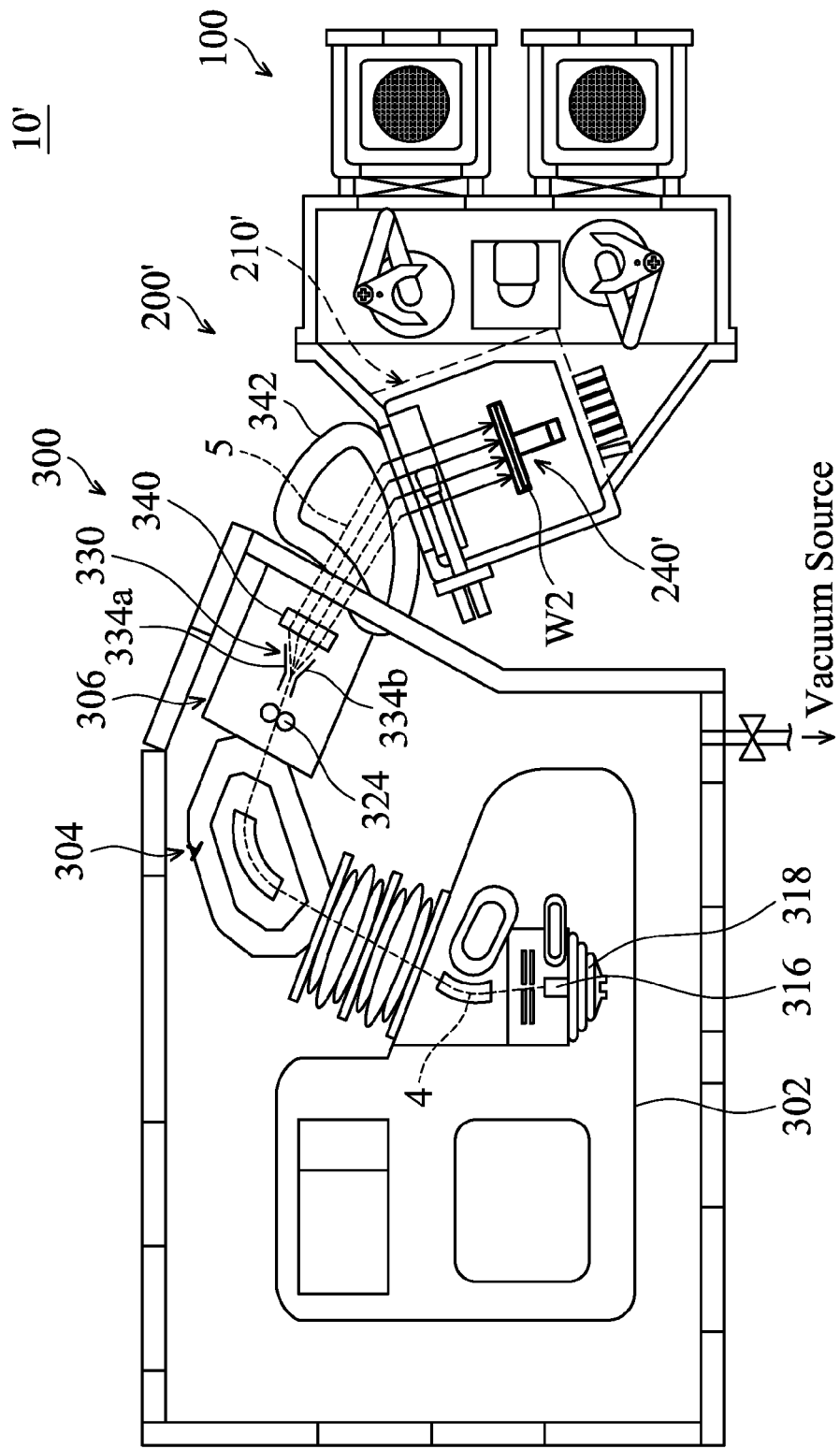
FIG. 10 is a top view of an ion implantation system, in accordance with some embodiments.

FIG. 10 illustrates the ion implanter system 10', in accordance with some embodiments. The beam generator module 300 is operable to carry out scanning techniques, in accordance with some embodiments. The beam generator module 300 includes a source terminal assembly 302, a beamline assembly 304, and a scan assembly 306 which are collectively arranged so as to inject ion (dopants) into the lattice of wafer W2 according to a desired dosing profile.

Specifically, during operation, an ion source 316 in the source terminal assembly 302 is coupled to a high voltage power supply 318 to ionize dopant molecules (e.g., dopant gas molecules), thereby forming a pencil ion beam 4. The beam line assembly 304 has a mass analyzer, and only the ions, having the appropriate charge-to-mass ratio, pass through the resolving aperture 324 and into the wafer W2.

Upon receiving the pencil ion beam 4, a scanner 330 within the scan assembly 306 laterally diverts or "scans" the pencil ion beam 4 back and forth in time (e.g., in a horizontal direction) to provide the scanned ion beam 5. In some embodiments, this type of scanned ion beam may be referred to as a ribbon beam. In some embodiments, the scanner 330 is an electrical scanner that includes a pair of electrodes 334a and 334b arranged on opposing sides of the scanned ion beam 5. In some embodiments, the scanner 330 is a magnetic scanner that provides a time-varying magnetic field in the beam path region, thereby scanning the ion beam in time. In some embodiments, only a single electrode (rather than a pair of electrodes) is used.

A parallelizer 340 in the scan assembly 306 can redirect the scanned ion beam 5 so that the ion beam strikes a surface of the wafer W2 at the same angle of incidence over the entire surface of the wafer W2. A deflection filter 342 diverts the parallelized scanned ion beam along a second axis, that can be different to the first axis. A vacuum pumping source typically keeps the ion beam transport passageway at vacuum to reduce the probability of ions being deflected from the beam path through collisions with air molecules.

In some embodiment, the controller module 400, as shown in FIG. 4, induces changes in variable power sources to provide a time-varying current or voltage on the electrodes 334 a and 334 b based on the detecting result of the detecting devices, thereby inducing an oscillatory time-varying electric field in the beam path region and scanning the ion beam back and forth in time.

Figure 11:
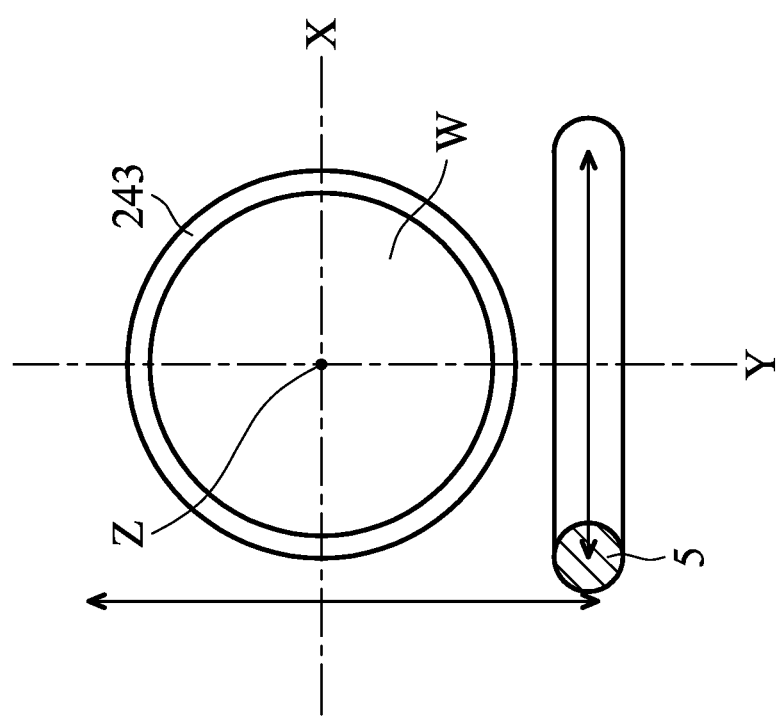
FIG. 11 is a top view of an ion implantation system, in accordance with some embodiments.

The ion beam 5 may be a spot beam, which has a circular cross section. Alternatively, the ion beam 5 may be a ribbon beam, which has a rectangular cross section. An ion beam (e.g., ion beam 5) may be of a smaller cross section than the diameter of wafer W. In order to achieve a uniform ion dose distribution on the wafer, either scanning an ion beam or moving a wafer relative to an ion beam is employed to increase the even implantation of the wafer area, as shown in FIG. 11.

In accordance with some embodiments, the ion beam 5 has a Gaussian-type non-uniform beam current distribution. More particularly, the ion beam 5 may have a bell shape in the middle and two long tails on both sides. A scan path is formed by scanning the ion beam 5 along ±X directions, as shown in FIG. 11. Along the scan path, the bell shape portion and the long tail portion of the ion beam 5 is averaged to form a uniform beam current distribution. The uniform beam current distribution may be commonly referred to as an ion beam current profile.

Figure 12:
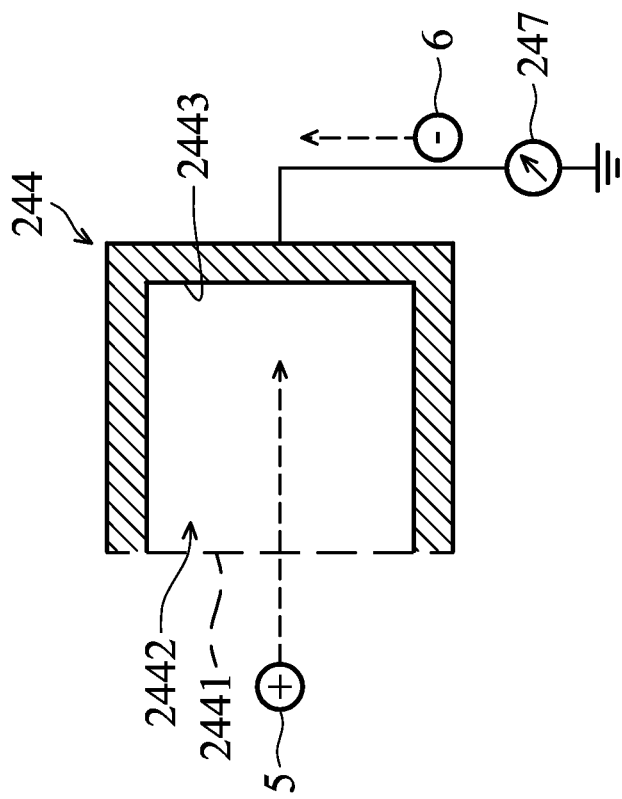
FIG. 12 is a schematic diagram of a detecting device, in accordance with some embodiments.

With reference to FIG. 12, in accordance with some embodiments, the detecting device 244 is a Faraday cup. The Faraday cup has a cup structure and an ion receiving surface 2441 with an opening 2442 formed on the cup structure and a plurality of walls that extend into the conductive material. Opposing the opening 2442 is a bottom surface 2443, formed in the conductive material, that has a plane substantially parallel with a plane of the ion receiving surface 2441. The opening 2442 allows the ions of the ion beam 5 to strike the bottom surface 2443. The Faraday cup senses ions from the ion beam 5 and induces a current 6 detected by a current meter 247. The current signals from the current meter 247 are sent to the controller module 400, as shown in FIG. 4.

Embodiments of the disclosure have many advantages. For example, the operation time for beam tuning is greatly reduced. Such a reduction of operation time also decrease contamination risk and enhances vacuum integrity in the end station chamber due to inside sensor design.

Embodiments of mechanisms for monitoring ion beam in an ion implanter system are provided. A detecting device is set to be over a surface of a mechanical scan drive including a wafer holder. The detecting device is positioned inside a process chamber of the ion implanter system. There is no need to move a detecting device outside of the process chamber into the process chamber for ion beam tuning. Therefore, operation time is greatly reduced, and the implantation quality is improved.

In accordance with some embodiments, an assembly of an ion implanter system is provided. The assembly includes a control unit, a wafer holder and a detecting device. The wafer holder and the detecting device are respectively positioned at two sides of the control unit. The control unit is configured to drive the wafer holder and the detecting device to rotate about at least one rotation axis.

In accordance with some embodiments, an ion implanter system is provided. The ion implanter system includes an end station chamber having an opening. The ion implanter system also includes an ion beam generator module configured to produce an ion beam. The ion beam enters the end station chamber via the opening. The ion implanter system further includes a wafer holder positioned in the end station chamber and a detecting device positioned in the end station chamber. In addition, the ion implanter system includes a control unit configured to drive the wafer holder and the detecting device to rotate about at least one rotation axis. The ion implanter system is selectively operated in a first and a second operating state. The wafer holder is farther away from the opening than the detecting device in a first operating state of the control unit. The wafer holder is closer to the opening than the detecting device in a second operating state of the control unit.

In accordance with some embodiments, a method for performing an ion implantation is provided. The method includes providing an ion beam into a chamber by using an ion beam generator module. The method also includes detecting the ion beam by using a detecting device on a control unit, and the detecting unit and a wafer holder are placed on two sides of the control unit. The method further includes estimating an ion dose distribution, based upon a detecting signal from the detecting device. In addition, the method includes determining if the ion dose distribution meets predetermined criteria. If the ion dose distribution meets the predetermined criteria, the ion beam is directed onto a wafer loaded on the wafer holder.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An assembly of an ion implanter system, comprising:
   a control unit;
   a wafer holder having a supporting surface and a back surface, wherein the supporting surface is configured for holding a wafer, and the back surface is opposite to the supporting surface; and
   a detecting device, wherein the wafer holder and the detecting device are respectively positioned at two sides of the control unit, and the control unit is configured to simultaneously drive the wafer holder and the detecting device to rotate about at least one rotation axis,
   wherein an orthogonal projection of the entire detecting device formed on the back surface of the wafer holder is within an edge of the wafer holder.

2. The assembly as claimed in claim 1, wherein the control unit comprises a first drive mechanism to drive the wafer holder and the detecting device to rotate about a horizontal axis, wherein the wafer holder and the detecting device are positioned at two opposite sides of the first drive mechanism.

3. The assembly as claimed in claim 2, wherein the first drive mechanism has an anterior surface and a posterior surface, and a central axis passes through the anterior surface and the posterior surface, wherein the wafer holder and the detecting device are disposed on the anterior surface and the posterior surface, respectively.

4. The assembly as claimed in claim 3, wherein the wafer holder and the detecting device are arranged along the central axis.

5. The assembly as claimed in claim 3, wherein the detecting device has an ion beam receiving surface, wherein the supporting surface of the wafer holder and the ion beam receiving surface are perpendicular to the central axis, and the ion beam receiving surface of the detecting device and the supporting surface of the wafer holder face two opposite directions.

6. The assembly as claimed in claim 2, wherein the control unit further comprises a second drive mechanism to drive the wafer holder and the detecting device to rotate about a vertical axis.

7. The assembly as claimed in claim 1, wherein the detecting device comprises a Faraday cup.

8. An ion implanter system, comprising:
   an end station chamber having an opening;
   an ion beam generator module configured to produce an ion beam, wherein the ion beam enters the end station chamber via the opening;
   a wafer holder positioned in the end station chamber;
   a detecting device positioned in the end station chamber; and
   a control unit configured to drive the wafer holder and the detecting device to rotate about at least one rotation axis and is selectively operated in a first and a second operating state,
   wherein the wafer holder is farther away from the opening than the detecting device in a first operating state of the control unit, and the wafer holder is closer to the opening than the detecting device in a second operating state of the control unit.

9. The ion implanter system as claimed in claim 8, wherein the control unit comprises a first drive mechanism to drive the wafer holder and the detecting device to rotate about a horizontal axis, wherein the wafer holder and the detecting device are positioned at two opposite sides of the first drive mechanism.

10. The ion implanter system as claimed in claim 9, wherein a central axis passes through the two opposite sides and is perpendicular to the horizontal axis, wherein the wafer holder and the detecting device are arranged along the central axis.

11. The ion implanter system as claimed in claim 9, wherein the wafer holder has a supporting surface, and the detecting device has an ion beam receiving surface, and the supporting surface and the ion beam receiving surface are perpendicular to the central axis.

12. The ion implanter system as claimed in claim 11, wherein the ion beam receiving surface is perpendicular to a main traveling direction of the ion beam in the second operating state of the control unit and the ion beam strikes the ion beam receiving surface.

13. The ion implanter system as claimed in claim 9, wherein the control unit further comprises a second drive mechanism to drive the wafer holder and the detecting device to rotate about a vertical axis.

14. The ion implanter system as claimed in claim 9, wherein the control unit further comprises a second drive mechanism to drive the wafer holder and the detecting device to move along a vertical axis.

15. The ion implanter system as claimed in claim 8, wherein the detecting device comprises a Faraday cup.

16. A method for performing an ion implantation comprising:
   providing an ion beam into a chamber by using an ion beam generator module;
   detecting the ion beam by using a detecting device on a control unit, wherein the detecting unit and a wafer holder are placed on two sides of the control unit, wherein detecting the ion beam is performed as the control unit is in a first operating state where the wafer holder is farther away from the opening than the detecting device;
   estimating an ion dose distribution, based upon a detecting signal from the detecting device;
   determining if the ion dose distribution meets predetermined criteria; and
   directing the ion beam onto a wafer loaded on the wafer holder if the ion dose distribution meets the predetermined criteria, wherein directing the ion beam onto a wafer is performed as the control unit is in a second operating state where the wafer holder is closer to the opening than the detecting device.

17. The method as claimed in claim 16, further comprising adjusting the scan frequency of the ion beam based upon the ion dose distribution if the ion dose distribution does not meet the predetermined criteria.

18. The method as claimed in claim 16, further comprising rotating the detecting device and the wafer holder, so as to irradiate the ion beam onto the wafer loaded on the wafer holder, wherein the detecting device and the wafer holder are arranged along a central axis parallel to the main traveling direction.

19. The method as claimed in claim 16, wherein the detecting device and the wafer holder are disposed on two opposite sides of the control unit.

20. The method as claimed in claim 15, wherein the detecting device comprises a Faraday cup.

\* \* \* \* \*